(12) United States Patent
Lee

(10) Patent No.: US 9,468,117 B2
(45) Date of Patent: Oct. 11, 2016

(54) MEMORY DEVICE HAVING HETEROGENEOUS TERMINALS

(71) Applicant: Jin-Woo Lee, Incheon (KR)

(72) Inventor: Jin-Woo Lee, Incheon (KR)

(73) Assignee: DUIN DIGITECH CO., LTD., Seoul (KR)

( * ) Notice: Subject to any disclaimer, the term of this patent is extended or adjusted under 35 U.S.C. 154(b) by 0 days.

(21) Appl. No.: 14/780,716

(22) PCT Filed: Dec. 17, 2013

(86) PCT No.: PCT/KR2013/011723
§ 371 (c)(1),
(2) Date: Sep. 28, 2015

(87) PCT Pub. No.: WO2014/163277
PCT Pub. Date: Oct. 9, 2014

(65) Prior Publication Data
US 2016/0054763 A1    Feb. 25, 2016

(30) Foreign Application Priority Data

Apr. 4, 2013 (KR) .................. 10-2013-0036761

(51) Int. Cl.
| | |
|---|---|
| G06F 1/16 | (2006.01) |
| H05K 5/02 | (2006.01) |
| H01R 27/00 | (2006.01) |
| H05K 5/00 | (2006.01) |
| H01R 24/62 | (2011.01) |

(52) U.S. Cl.
CPC ........... *H05K 5/0278* (2013.01); *G06F 1/1684* (2013.01); *H01R 27/00* (2013.01); *H05K 5/0004* (2013.01); *H05K 5/0247* (2013.01); *H01R 24/62* (2013.01)

(58) Field of Classification Search
CPC ........................... H05K 5/0278; G06F 1/1684
USPC ............................. 361/679.31; 439/131, 135
See application file for complete search history.

(56) References Cited

U.S. PATENT DOCUMENTS

| | | | | |
|---|---|---|---|---|
| 6,456,500 B1 * | 9/2002 | Chen | .................... | H05K 5/0278 361/736 |
| 6,733,329 B2 * | 5/2004 | Yang | ................ | G06K 19/07732 439/518 |
| 6,778,401 B1 * | 8/2004 | Yu | .................... | G06K 19/07732 361/736 |
| 6,926,544 B2 * | 8/2005 | Lee | ....................... | H01R 13/447 439/147 |
| 6,994,568 B2 * | 2/2006 | Huang | .................. | H01R 13/50 235/492 |
| 7,125,265 B2 * | 10/2006 | Weng | .................... | H01R 27/00 361/737 |

(Continued)

FOREIGN PATENT DOCUMENTS

| | | |
|---|---|---|
| KR | 1020090027981 | 3/2009 |
| KR | 2004454760000 | 8/2009 |
| KR | 2004562220000 | 10/2011 |

*Primary Examiner* — Adrian S Wilson
(74) *Attorney, Agent, or Firm* — IPLA P.A.; James E. Bame

(57) ABSTRACT

A memory device having heterogeneous terminals easily connects the memory device to a computer or a portable terminal without a specific gender. When a memory unit is connected to a computer, the memory unit slides out of the body and the first terminal of the memory unit is inserted into a USB connector of the computer, and when the memory unit is connected to a portable terminal, the connection unit slides out of the body and the second terminal of the connection unit is inserted in a mini-USB connector of the portable terminal, so it is possible to easily connect the memory unit to the portable terminal without a specific gender.

9 Claims, 14 Drawing Sheets

(56) References Cited

U.S. PATENT DOCUMENTS

| | | | |
|---|---|---|---|
| 7,416,419 B2 * | 8/2008 | Collantes, Jr. | H05K 9/0067 439/76.1 |
| 7,466,556 B2 * | 12/2008 | Hiew | G06F 12/1416 361/736 |
| 7,500,858 B2 * | 3/2009 | Emerson | H01R 13/447 439/131 |
| 7,535,719 B2 * | 5/2009 | Hiew | H01L 21/565 361/715 |
| 7,566,248 B2 * | 7/2009 | Yang | H05K 5/0278 361/735 |
| 7,740,495 B1 * | 6/2010 | Lo | G06K 19/07 439/142 |
| 8,052,438 B1 * | 11/2011 | Hung | H01R 24/60 439/131 |
| 8,684,753 B2 * | 4/2014 | Zhang | 439/131 |
| 2005/0130469 A1 * | 6/2005 | Ikenoue | H05K 5/0278 439/131 |
| 2008/0019090 A1 * | 1/2008 | Zhu | H05K 5/0278 361/679.31 |
| 2008/0026614 A1 * | 1/2008 | Emerson | H01R 13/447 439/136 |
| 2008/0192149 A1 * | 8/2008 | Lee | H04N 5/64 348/725 |
| 2011/0013354 A1 | 1/2011 | Huang | |

\* cited by examiner (a)   (b)

(a)   (b)

Fig. 13
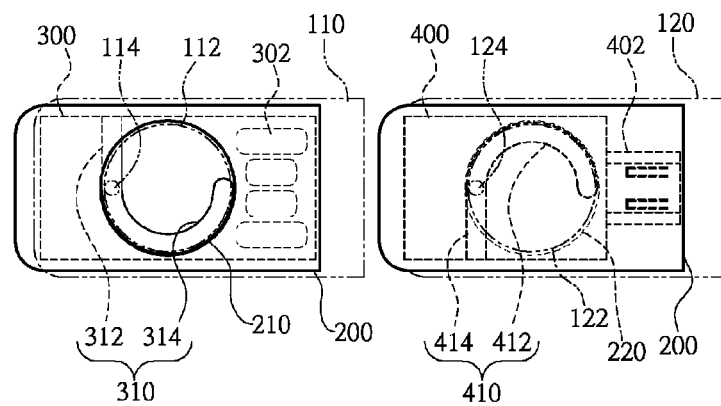
(a)
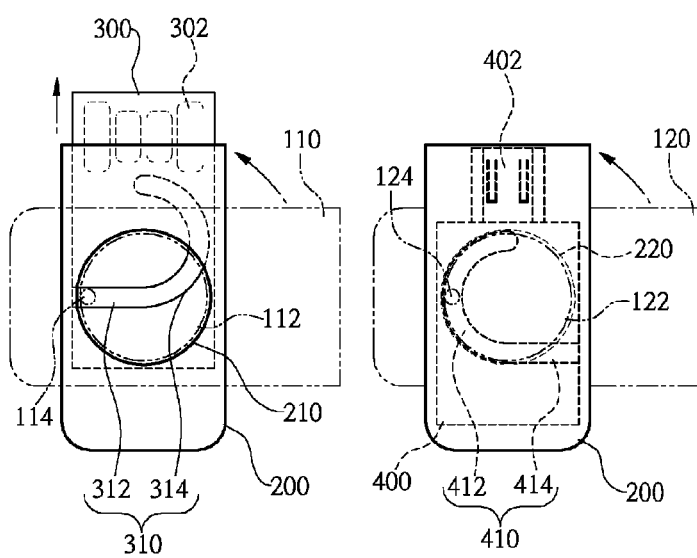
(b)

Fig. 14
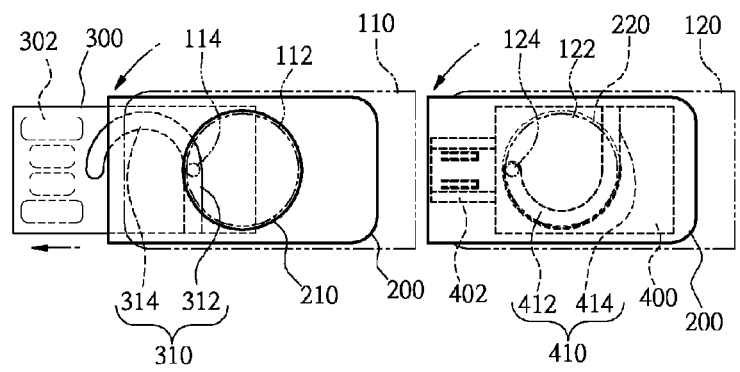
(a)
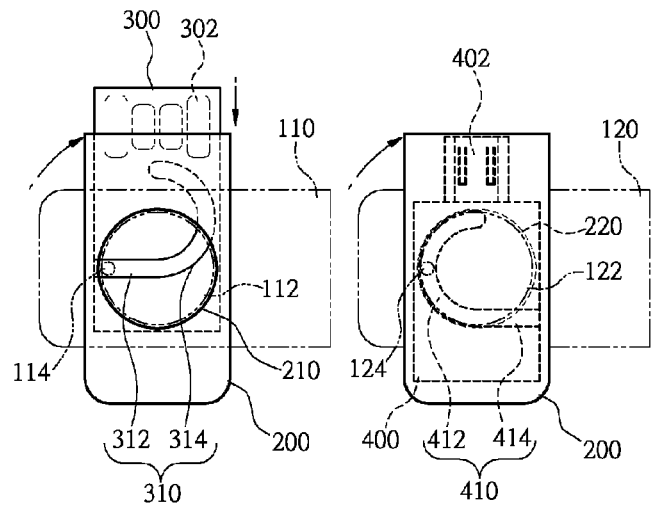
(b)

Fig. 15
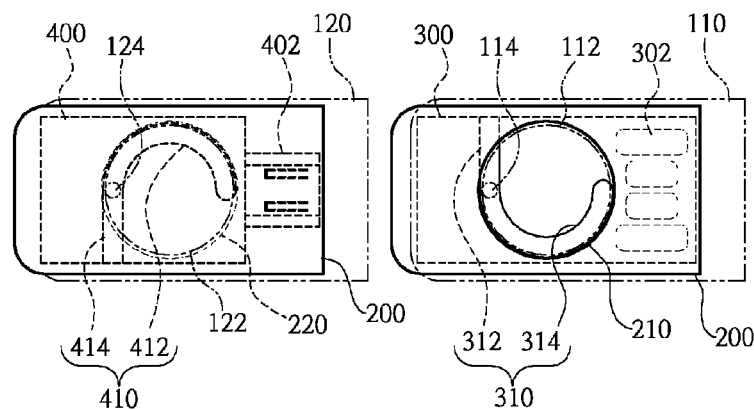
(a)
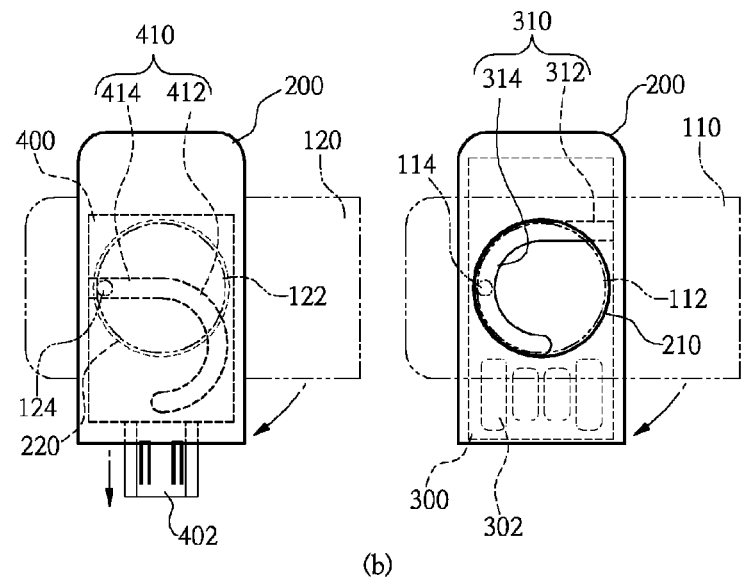
(b)

Fig. 16
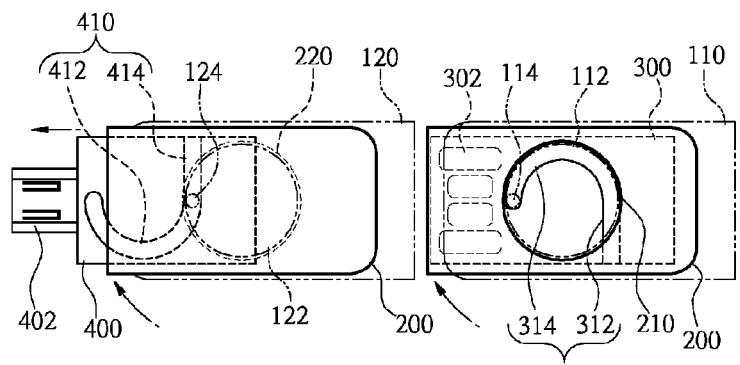
(a)
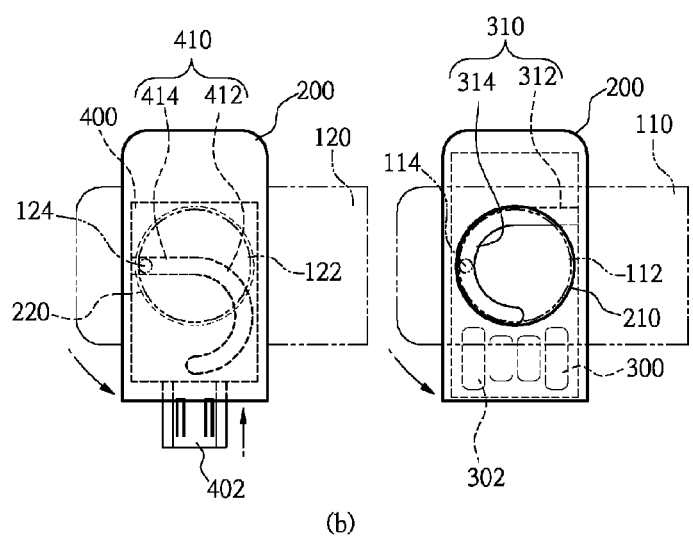
(b)

MEMORY DEVICE HAVING HETEROGENEOUS TERMINALS

BACKGROUND

The present invention relates to a memory device having heterogeneous terminals and, more particularly, to a memory device having heterogeneous terminals that can connect the memory device to a computer or a portable terminal without a specific gender.

In general, a USB (Universal Serial Bus) memory includes a flash memory or a small hard disk therein to be connected to an USB port of an external device in a USB interface type so that existing data can be read or specific data can be written through data communication at a predetermined speed. Such a USB device, as compared with portable storages, can transmit large files, has a high communication speed, can be simply used in a plug-and-play type, and can be formed in the shape of a small stick that can be easily carried, so it is used as a portable storage for various external devices such as a computer, a camera, a notebook, and a portable terminal.

On the other hand, a USB OTG (On-The-Go) is a technology making a USB port available as a host and a slave, and using the OTG makes it possible to transmit and receive data with a USB memory connected directly to a portable terminal without a PC.

FIG. 1 is a view illustrating a process of connecting a memory device to a portable terminal in the related art. Referring to FIG. 1, a memory device 10 of the related art includes a flash memory therein and has a USB terminal 12 at a side for transmitting data in a USB interface type. A portable terminal 20, which may be a mobile phone, a smartphone, a portable computer, a PMP, a digital camera, and an MP3 player, has a pin type connector 22 at a side for connection with an external interface for charging or data transmission. The connector 22 for connection with an external interface has a connection terminal of which the size is standardized in accordance with manufacturers or standards of the portable terminal 20, so a user can conveniently connect or disconnect necessary peripheral devices anytime anywhere, and it is connected with those peripheral devices through an interface such as a USB to share data.

On the other hand, the size of the connection terminal of a USB is standardized, so a user can conveniently connect or disconnect necessary peripheral devices anytime anywhere. As UBS connectors using an USB interface, there are an A-type connector and a B-type connector. The A-type connector is a connector that is connected to a USB terminal of a host computer and the B-type connector is a connector that is connected to a USB terminal of a smartphone to download data from a computer system. Further, as the portable terminal 20 is made in small sizes, a mini-USB connector 22 standardized by making a B-type connector in a small size is generally used.

However, the memory device 10 has the USB terminal 12, which is an A-type connector, usually for connection with a computer, so, in order to connect the memory device 10 to the portable terminal 20, a user connects the portable terminal 20 and the memory device 20 to each other in a USB type by, first, individually connecting a side of a gender 30 to the connector 22 of the portable terminal 20 and then connecting the memory device 10 to another side of the gender 30, thereby transmitting and receiving various data.

Since such a gender 30 is necessary for connecting the memory device 10 and the portable terminal 20 to each other, as described above, a user has to always carry such a gender 30 and connect the gender 30 to the portable terminal 20 every time using the portable terminal, so it is inconvenient for the user.

SUMMARY OF THE INVENTION

An object of the present invention for solving the problem in the related art is to provide a memory device having heterogeneous terminals that can easily connect of the memory device to a computer or a portable terminal without a specific gender.

In order to solve the problem, the present invention provides a memory device having heterogeneous terminals that includes: a housing including a first plate, a second plate disposed at a corresponding position under the first plate, and an extension integrally connecting first ends of the first plate and the second plate; a body rotatably disposed between the first plate and the second plate and having an opening at a first end; a memory unit disposed at an upper portion in the body to slide and having a first terminal at a first end; and a connection unit disposed at a lower portion in the body to slide and having a second terminal at a first end, in which any one of the memory unit and the connection unit slides out of the body such that the moved end is exposed outside the body, with the opening of the body positioned toward second ends of the first plate and the second plate, and when the first terminal of the memory unit is positioned inside the body and the second terminal of the connection unit is exposed outside the body, the first terminal of the memory unit and the second terminal of the connection unit are electrically connected to each other.

Further, the first terminal and the second terminal may be USB terminals having different sizes.

Further, the housing may include a first rotary member disposed on an inner side of the first plate, a first protrusion spaced outward from a center of the first rotary member, a second rotary member disposed on an inner side the second plate to face the first rotary member, and a second protrusion spaced outward from a center of the second rotary member; the body may include a first guide hole formed on a top facing the first rotary member such that the first rotary member is inserted, and a second guide hole formed on a bottom facing the second rotary member such that the second rotary member is inserted; the memory unit may include a first guide formed such that the first protrusion passing through the first guide hole is inserted, with the opening of the body positioned toward the extension of the housing; the connection unit may include a second guide formed such that the second protrusion passing through the second guide hole is inserted, with the opening of the body positioned toward the first ends of the first plate and the second plate, and when the body is rotated forward or backward, the first protrusion or the second protrusion may be moved along the first guide or the second guide, which is elongated, and revolved about a center of the first rotary member of the second rotary member, and the memory unit or the connection unit may slide inside or outside the body in accordance with displacement by the revolution of the first protrusion or the second protrusion, so the first terminal or the second terminal is exposed outside the body or not.

Further, the first guide of the memory unit may include a first memory guide rail elongated perpendicular to the longitudinal direction of the memory unit at a first point in which the first protrusion is inserted, when the opening of the body is positioned toward the extension of the housing, and a second memory guide rail formed in the opposite direction to the first memory guide rail, along the first guide hole at the first point; the second guide of the connection unit may include a first connection guide rail formed along the second guide hole in the opposite direction to the second memory guide rail, at a second point where the second protrusion is inserted, when the opening of the body is positioned toward the extension of the housing, and a second connection guide rail elongated perpendicular to the longitudinal direction of the connection unit in the opposite direction to the first memory guide rail at the second point, when the opening of the body positioned toward the extension of the housing is rotated forward to the second ends of the first plate and the second plate of the housing, the first protrusion positioned between the first memory guide rail and the second memory guide rail revolves along the first memory guide rail and slides the memory unit, the second protrusion positioned between the first connection guide rail and the second connection guide rail revolves along the first connection guide rail formed in a revolution direction of the second protrusion without moving the connection unit, and when the opening of the body positioned toward the extension of the housing is rotated backward to the second ends of the first plate and the second plate of the housing, the first protrusion positioned between the first memory guide rail and the second memory guide rail moves along the second memory guide rail formed in a movement direction of the first protrusion without moving the memory unit, and the second protrusion positioned between the first connection guide rail and the second connection guide rail moves along the second connection guide rail and slides the connection unit.

Further, guide rails may be formed on sides of the memory unit or the connection unit and sliding guides may be formed at positions corresponding to the guide rails in the body so that the guide rails are guided to slide.

Further, when the opening of the body positioned toward the extension of the housing is rotated forward the second ends of the first plate and the second plate of the housing, an outer side of the second memory guide rail of the memory unit may be formed to face a revolution path of the first protrusion and an inner side of the second memory guide rail may be formed to face or not the revolution path of the first protrusion, and the opening of the body positioned toward the extension of the housing may be rotated backward the second ends of the first plate and the second plate of the housing, an outer side of the first connection guide rail of the connection unit may be formed to face a revolution path of the second protrusion and an inner side of the first connection guide rail of the connection unit may be formed to face or not the revolution path of the first protrusion.

Further, a connection terminal may be formed on a top of the connection unit to be electrically connected with the first terminal when the first terminal of the memory unit is positioned inside the body and the second terminal of the connection unit is exposed outside the body.

A substrate may be disposed between the memory unit and the connection unit, and when the first terminal of the memory unit is positioned inside the body and the second terminal of the connection unit is exposed outside the body, a top of the substrate may be electrically connected with the first terminal of the memory unit and a bottom of the substrate may be electrically connected with the connection unit.

Further, the memory unit and the connection unit may be electrically connected to each other by a connection wire.

According to the present invention, when a memory unit is connected to a computer, the memory unit slides out of the body and the first terminal of the memory unit is inserted into a USB connector of the computer, and when the memory unit is connected to a portable terminal, the connection unit slides out of the body and the second terminal of the connection unit is inserted in a mini-USB connector of the portable terminal, so it is possible to easily connect the memory unit to the portable terminal without a specific gender.

Further, according to the present invention, since it is possible to selectively expose a necessary one of the first terminal of the memory unit and the second terminal of the connection unit, it is possible to easily connect the first terminal of the memory exposed out of the body or the second terminal of the connection unit exposed out of the body to a computer or a portable terminal.

BRIEF DESCRIPTION OF DRAWINGS

FIGS. 13 and 14 are views schematically showing the memory unit sliding out of the body in the memory device having heterogeneous terminals according to a preferred embodiment of the present invention.

FIGS. 15 and 16 are views schematically showing the connection unit sliding out of the body in the memory device having heterogeneous terminals according to a preferred embodiment of the present invention.

Figure 1:
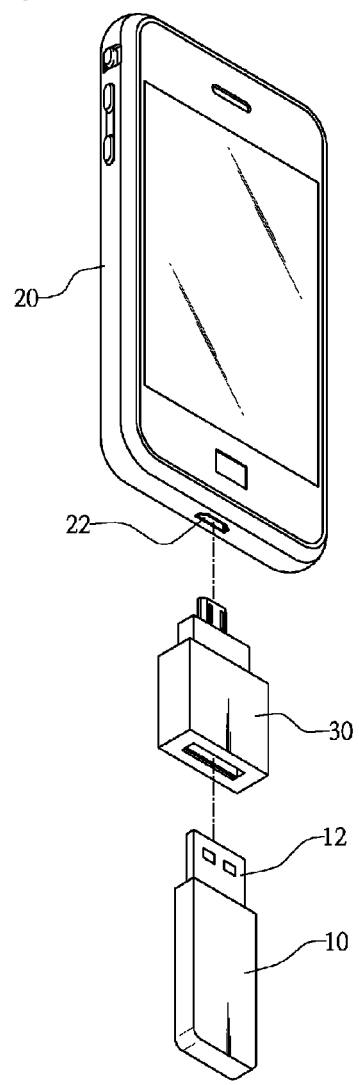
FIG. 1 is a view illustrating a process of connecting a memory device to a portable terminal in the related art.

<Description of the Reference Numerals in the Drawings>

| | |
|---|---|
| 100: housing | 110: first plate |
| 112: first rotary member | 114: first protrusion |
| 120: second plate | 122: second rotary member |
| 124: second protrusion | 130: extension |
| 200: body | 202: opening |

-continued

<Description of the Reference Numerals in the Drawings>

| | |
|---|---|
| 210: first guide hole | 220: second guide hole |
| 230: first sliding guide | 240: second sliding guide |
| 300: memory unit | 302: first terminal |
| 310: first guide | 312: first memory guide rail |
| 314: second memory guide rail | |
| 320: first guide rail | 400: connection unit |
| 402: second terminal | 410: second guide |
| 412: first connection guide rail | |
| 414: second connection guide rail | |
| 420: second guide rail | 430: connection terminal |
| 500: substrate | 510: upper terminal |
| 520: lower terminal | 530: connection wire |
| 550: cable | |

DETAILED DESCRIPTION OF THE INVENTION

Hereinafter, a memory device having heterogeneous terminals according to a preferred embodiment of the present invention will be described in detail with reference to the accompanying drawings.

Figure 2:
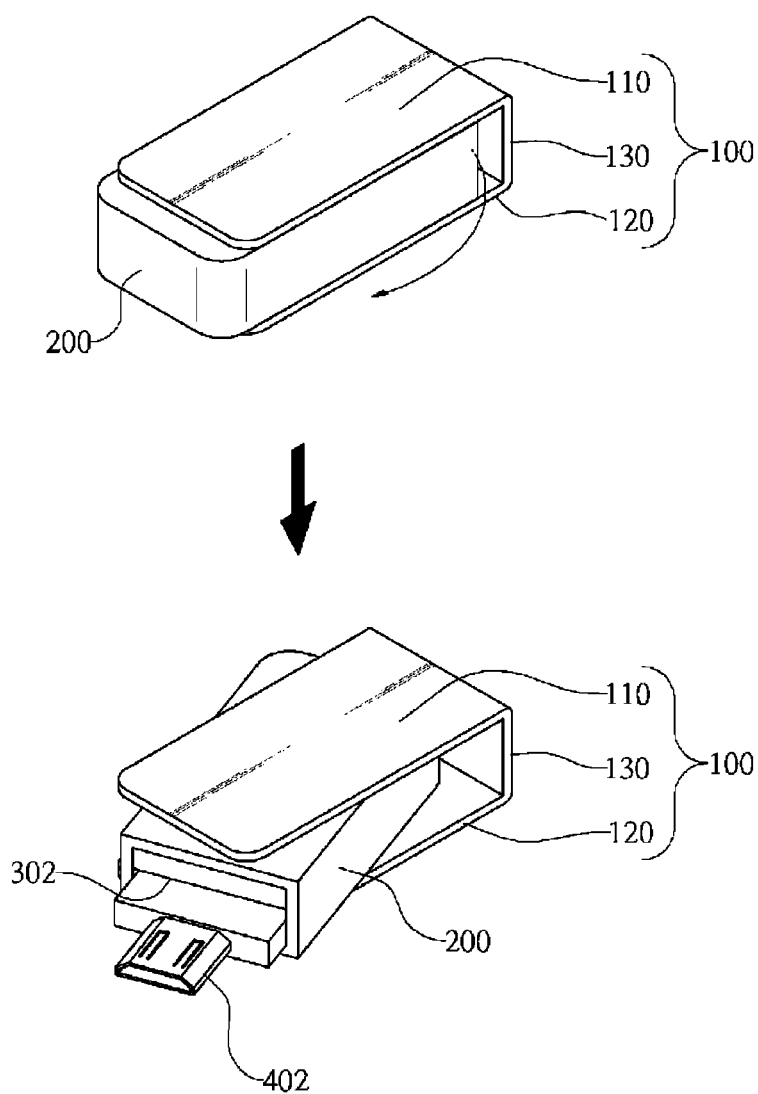
FIG. 2 is a view schematically showing a memory device having heterogeneous terminals according to a preferred embodiment of the present invention.
Figure 3:
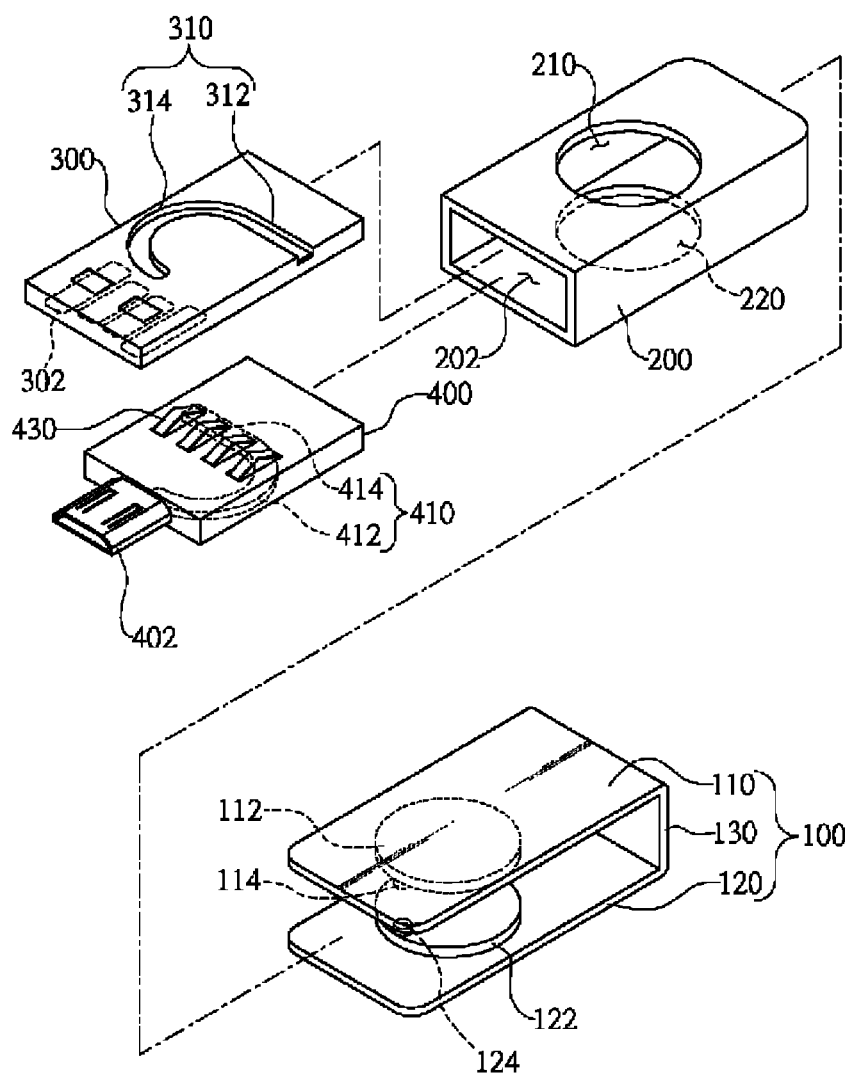
FIG. 3 is an exploded view showing the memory device having heterogeneous terminals according to a preferred embodiment of the present invention.
Figure 4:
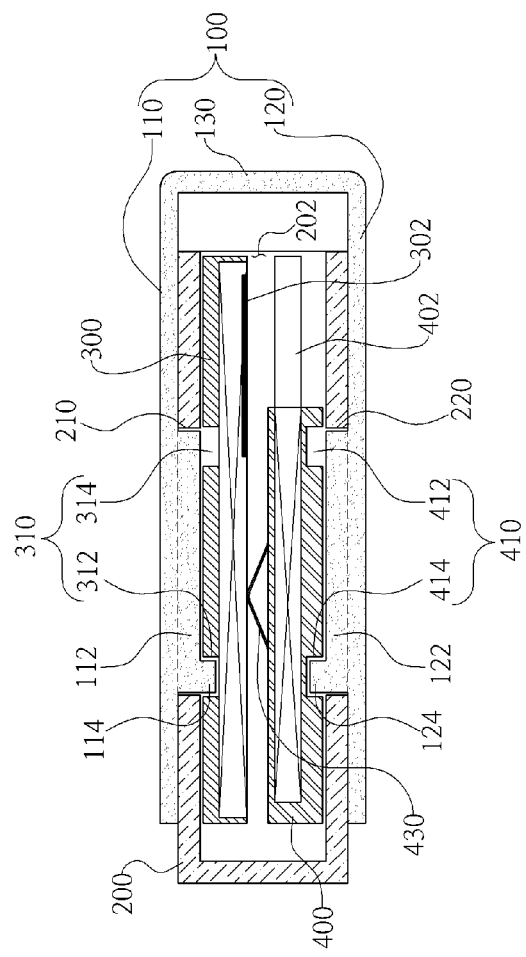
FIG. 4 is a view showing a cross-section of the memory device having heterogeneous terminals according to a preferred embodiment of the present invention.

FIG. 2 is a view schematically showing a memory device having heterogeneous terminals according to a preferred embodiment of the present invention, FIG. 3 is an exploded view showing the memory device having heterogeneous terminals according to a preferred embodiment of the present invention, FIG. 4 is a view showing a cross-section of the memory device having heterogeneous terminals according to a preferred embodiment of the present invention.

Referring to FIGS. 2 to 4, a memory device having heterogeneous terminals according to a preferred embodiment of the present invention includes a housing 100, a body 200 rotatably coupled to the housing 100, a memory unit 300 disposed at an upper portion in the body 200, and a connection unit 400 disposed at a lower portion in the body 200.

The housing 100 has a first side and a second side that are bent to form a U-shaped cross-section, in which the first side is a first plate 110, the second side is a second plate 120, and an extension 130 is formed between predetermined longitudinal ends of the first plate 110 and the second plate 120. The body 200 is disposed in the space between the first plate 110 and the second plate 120, with the first plate 110 facing the top of the body 200 and the second plate 120 facing the bottom of the body 200. A ring (not shown) may be formed on the extension for easy connection to a mobile phone or a key ring. A first rotary member 112 and a second rotary member 122 are formed on the inner sides facing each other, respectively, of the first plate 110 and the second plate 120 and the body 200 pivots on the first and second rotary members 112 and 122, which will be described below.

The body 200 has a space for keeping the memory unit 300 and the connection unit 400 and an opening 202 at a longitudinal end, that is, at the front so that the first terminal 302 of the memory unit 300 or the second terminal 402 of the connection unit 400 can protrude out of the body 200. A first guide hole 210 and a second guide hole 220 are formed through the center of the top and the bottom of the body 200, respectively, to insert the first and second rotary members 112 and 122. When the body 200 is disposed inside the housing 100, the first rotary member 112 and the second rotary member 122 of the housing 100 are inserted in the first guide hole 210 and the second guide hole 220 of the body 200, respectively, so the body 200 is rotated inside the housing 100. When the body 200 is rotated inside the housing 100 and the opening 202 of the body 200 is positioned at the extension 130 of the housing 100, the memory unit 300 or the connection unit 400 in the body 200 cannot be moved outside, so the first terminal 302 of the memory unit 300 and the second terminal 402 of the connection unit 400 is protected from external shock or dirt. Further, when the opening 202 of the body 200 is positioned at second ends of the first and second plates 110 and 120 of the housing 100, the first terminal 302 of the memory unit or the second terminal 402 of the connection unit in the body 200 protrudes outside through the opening 202 of the body 200 to be exposed outside the body 200.

The memory unit 300 includes a memory (not shown) such as a flash memory and a PCB (Printed Circuit Board) (not shown) having a controller and the first terminal 302 is formed on the bottom of an end portion to be connected to a USB port of an external device (now shown). The memory unit 300 is slidably inserted in the upper portion of the body 200.

The connection unit 400 is slidably inserted in a lower portion of the body 200, under the memory unit 300. The second terminal 402 is formed at a first end of the connection unit to be connected to a connector of a portable terminal. Although the memory unit 300 is inserted in the upper portion of the body 200 and the connection unit is inserted in the lower portion of the body 200 in an embodiment of the present invention, the prevent invention is not limited thereto and the memory unit 300 may be inserted in the lower portion of the body 200 and the connection unit 400 may be inserted in the upper portion of the body 200. Further, although the first terminal 302 of the memory unit 300 and the second terminal 402 of the connection unit 400 use a USB interface in an embodiment of the present invention, the present invention is not limited thereto and they may use not the USB interface, but other interfaces.

USB connectors using a USB interface are generally classified into an A-type connector that is connected to a host computer etc. and a small-sized B-type connector that is connected to a portable terminal etc., so the first terminal 302 of the memory unit 300 may be a common USB terminal that is connected to an A-type connector and the second terminal 402 of the connection unit 400 may be a mini-USB terminal that is connected to a small-sized B-type connector.

Depending on rotational positions of the body 200 inside the housing 100, the first terminal 302 of the memory unit 300 or the second terminal 402 of the connection unit is exposed outside the memory 200 by sliding the memory unit 300 or the connection unit 400 out of the body 200, or they are not exposed, and for this purpose, in the present invention, the housing 100 has first and second protrusions 114 and 124 and the connection unit 400 has a second guide 410.

The first protrusion 114 is formed on the first rotary member 112 of the first plate 110 of the housing 100, at a predetermined position close to the second end of the first plate 110 from the center of the first rotary member 112. The second protrusion 114 is formed on the second rotary member 120 of the second plate 120 of the housing 100, at a predetermined position close to the second end of the second plate 120 from the center of the second rotary member 120. The first and second guides 310 and 410 are formed on the top of the memory unit 300 and the bottom of the connection unit 400 so that the first and second protrusions 114 and 124 are inserted therein. As the body 200 is rotated forward or backward, the first and second protrusions 114 and 124 of the housing 100 push or pull the memory unit 300 and the connection unit 400 while revolving along the first and second guide holes 210 and 220 of the body 200, so the memory unit 300 or the connection unit 300 slides, and accordingly, the first terminal 302 of the memory unit 300 or the second terminal 402 of the connection unit 400 selectively protrudes out of the body 200. The process of sliding of the first terminal 302 of the memory unit 300 or the second terminal 402 of the connection unit 400 will be described in detail below with reference to FIGS. 13 to 16.

Although the memory unit 300 and the connection unit 400 are slid by movement of the first and second protrusions 114 and 124 with rotation of the body 200, the present invention is not limited thereto and the memory unit 300 and the connection unit 400 may be slid directly by external force.

Figure 5:
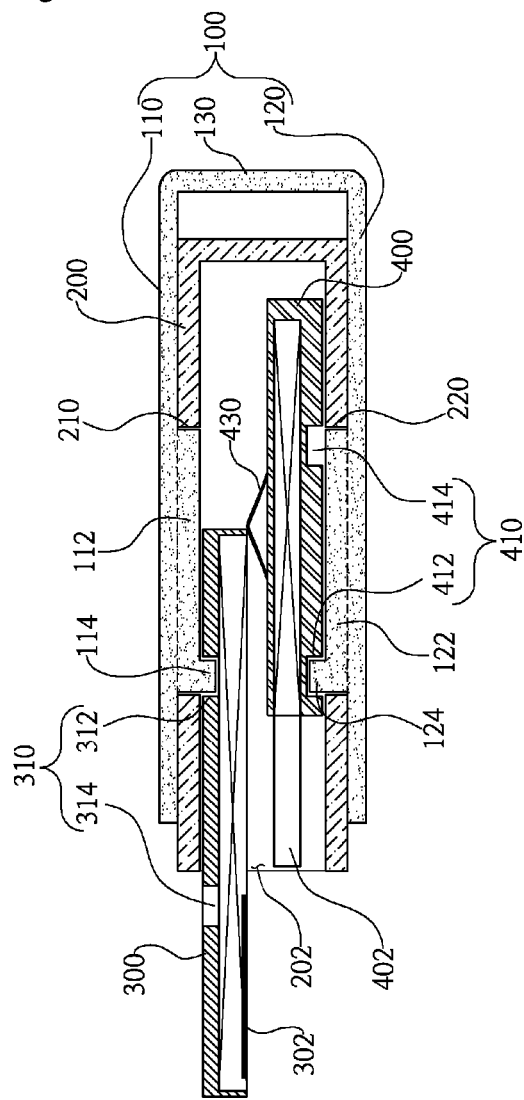
FIG. 5 is a view schematically showing a memory unit that has been slid out of a body in the memory device having heterogeneous terminals according to a preferred embodiment of the present invention.

FIG. 5 is a view schematically showing a memory unit that has been slid out of a body in the memory device having heterogeneous terminals according to a preferred embodiment of the present invention.

Referring to FIG. 5, when the memory unit 300 is connected to an external device such as a computer, the body 200 is rotated, the memory unit 300 is slid out of the body 200, and then the first terminal 302 of the memory unit 300 is inserted into a USB connection of the computer, thereby transmitting and receiving data. According to the present invention, as described above, it is possible to easily and selectively access a computer, using the first terminal 302 of the memory unit 300, if necessary.

Figure 6:
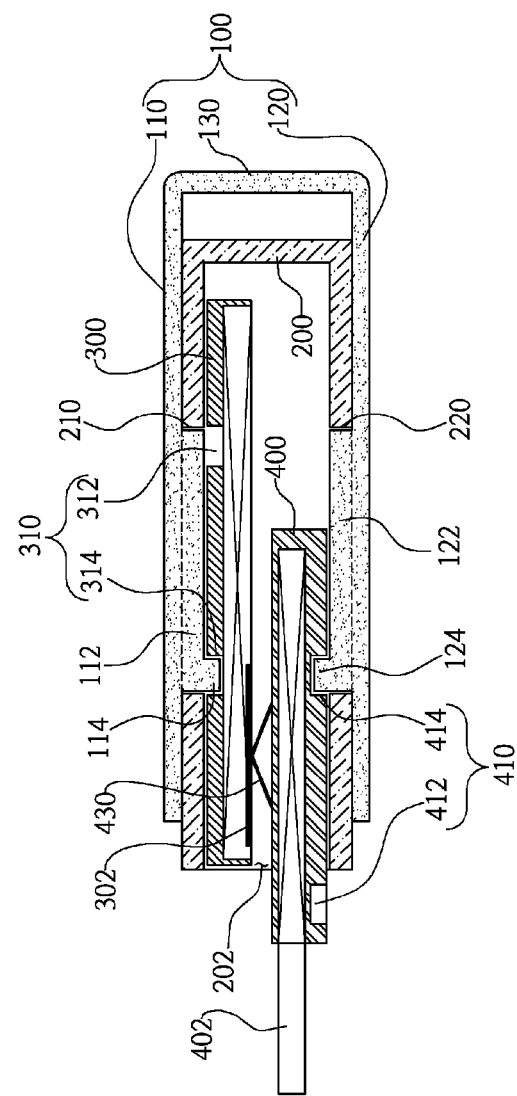
FIG. 6 is an exploded view showing a connection unit that has been slid out of the body of the memory device having heterogeneous terminals according to a preferred embodiment of the present invention.

FIG. 6 is an exploded view showing a connection member that has been slid out of the body of the memory device having heterogeneous terminals according to a preferred embodiment of the present invention.

Referring to FIG. 6, when the body 200 is rotated with the memory unit 300 therein, the second terminal 402 of the connection unit 400 is exposed outside the body 200. A connection terminal 430 for electric connection with the first terminal 302 is formed at a position on the connection unit 400 that corresponds to the first terminal 302 of the memory unit 300 and is electrically connected with the second terminal 402, so the second terminal 402 of the connection unit 400 and the first terminal 302 of the memory unit 300 are electrically connected.

A mini-USB connector is generally used for portable terminals such as a smartphone and the first terminal 302 of the memory unit 300 is a common first terminal 302 for connection with an external device such as a computer. Accordingly, a specific gender was used to connect the memory unit 300 to a portable terminal in the related art, but according to the present invention, a portable terminal and the memory unit 300 are connected to each other by connecting the second terminal 402 of the connection unit 400 to a connector of a portable terminal without a specific gender. It is possible to easily connect a portable terminal and a memory unit 300 by sliding the connection unit 400 out of the body 200 and inserting the second terminal 402 of the connection unit 400 into a mini-USB connection of the portable terminal when connecting the portable terminal and the memory unit 300 to each other.

Figure 7:
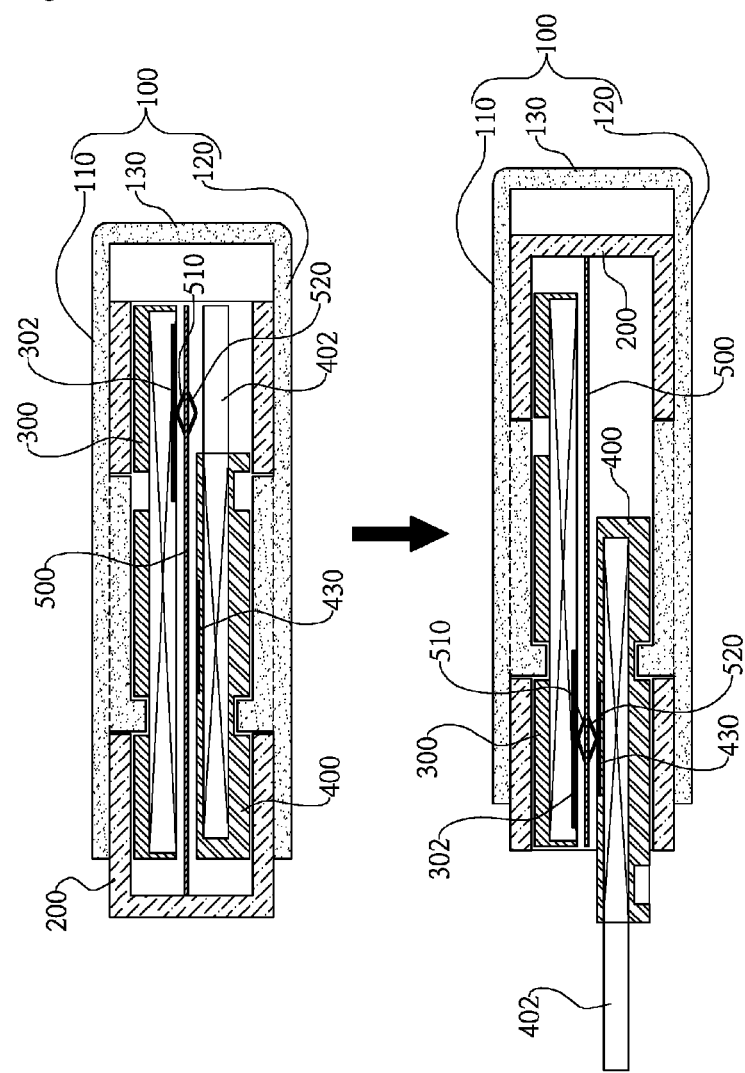
FIGS. 7 to 9 are views illustrating various examples in which a second terminal of the connection unit and a first terminal of the memory unit are electrically connected, when the connection unit slides out of the body in the memory device having heterogeneous terminals according to a preferred embodiment of the present invention.
Figure 8:
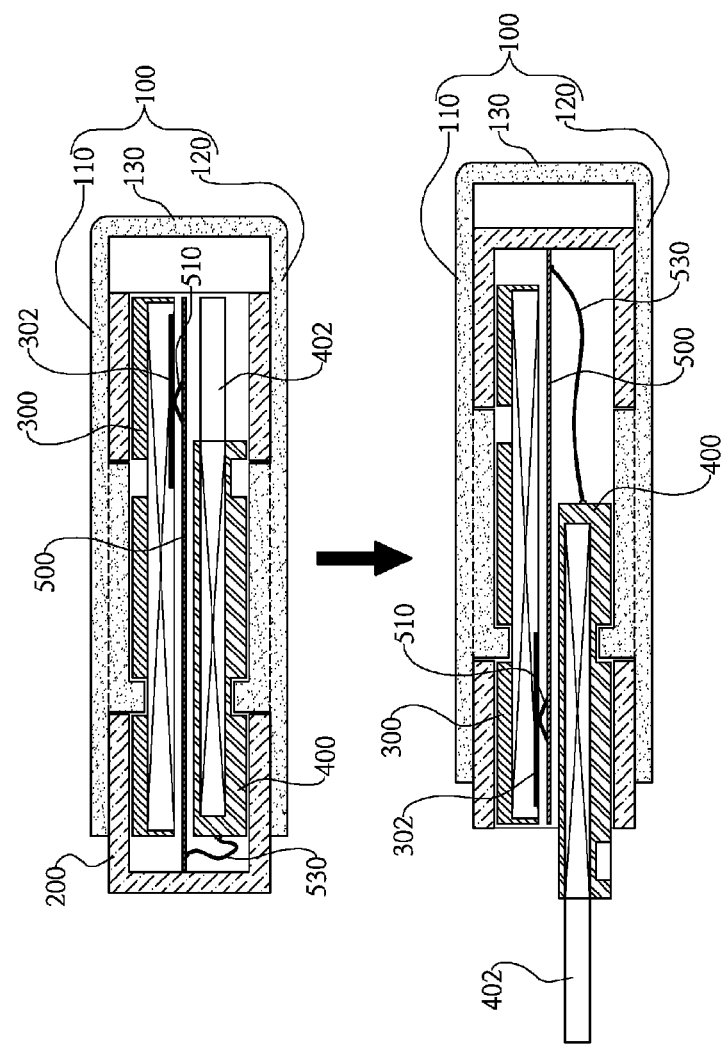
Figure 9:
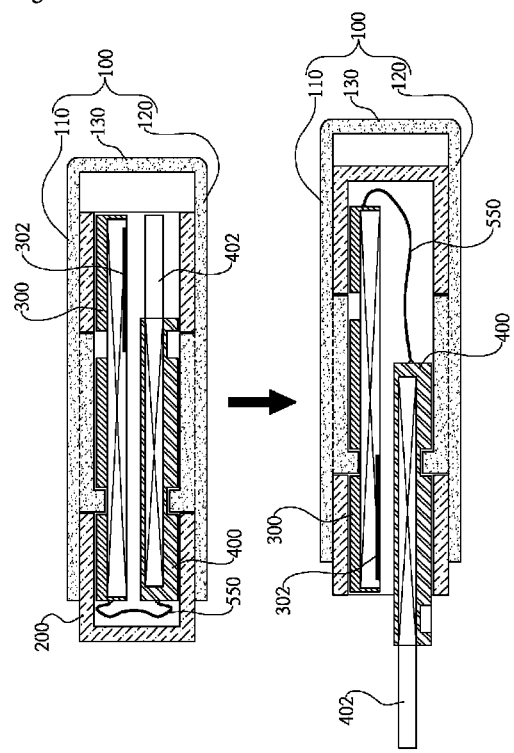

FIGS. 7 to 9 are views illustrating various examples in which a second terminal of the connection unit and a first terminal of the memory unit are electrically connected, when the connection unit slides out of the body in the memory device having heterogeneous terminals according to a preferred embodiment of the present invention.

Referring to FIG. 7, a substrate 500 is disposed between the memory unit 300 and the connection unit 400 inside the body 200 and the connection terminal 430 for electric connection with the first terminal 302 of the memory unit 300 is formed at a position, which corresponds to the first terminal 302, on the top of the connection unit 400. When the body 200 is rotated toward the second ends of the first and second plates 110 and 120 of the housing 100, with the memory unit 300 inside the body 200, the second terminal 402 of the connection unit 400 is exposed outside the body 200. An upper terminal 510 for electric connection with the first terminal 302 of the memory unit 300 is formed on the top of the substrate 500 and a lower terminal 520 for electric connection with the second terminal 402 of the connection unit 400 is formed on the bottom of the substrate 500, so the second terminal 402 of the connection unit 400 and the first terminal 302 of the memory unit 300 are electrically connected. Accordingly, it is possible to easily connect a portable terminal and the memory unit 300 without a specific gender by inserting the second terminal 402 exposed outside the body 200 of the connection unit 400 into a mini-USB connector of the portable terminal.

Referring to FIG. 8, the substrate 500 is disposed between the memory unit 300 and the connection unit 400 inside the body 200. When the body 200 is rotated toward the second ends of the first and second plates 110 and 120 of the housing 100, with the memory unit 300 inside the body 200, the second terminal 402 at a first end of the connection unit 400 is exposed outside the body 200. The upper terminal 510 for electric connection with the first terminal 302 of the memory unit 300 is formed on the top of the substrate 500 and a connection wire 530 for electric connection with the second end of the connection unit 400 is formed on the bottom of the substrate 500, so the second terminal 402 of the connection unit 400 and the first terminal 302 of the memory unit 300 are electrically connected. By inserting the second terminal 402 of the connection unit 400 into a mini-USB connector of a portable terminal, it is possible to connect the portable terminal and the memory unit 300 without a specific gender.

Referring to FIG. 9, the first terminal 302 is disposed at a first end of the memory unit inside the body 200 and the second terminal 402 is disposed at a first end of the connection unit 400 inside the body 200. A second side of the memory unit 300 and a second side of the connection unit 400 are electrically connected by a cable 550, so the first terminal 302 of the memory unit 300 and the second terminal 402 of the connection unit 400 are electrically connected to each other. In this state, when the body 200 is rotated toward the second ends of the first and second plates 110 and 120 of the housing 100, the second terminal 402 at the first end of the connection unit 400 is exposed outside the body 20, and it is possible to easily connect a portable terminal and the memory unit 300 by inserting the exposed second terminal 402 of the connection unit 400 into a mini-USB connector of the portable terminal.

Figure 10:
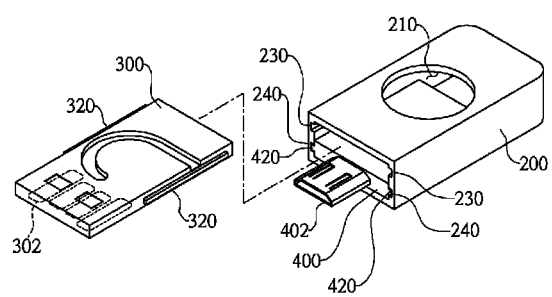
FIG. 10 is a view illustrating the memory unit and the connection unit sliding along sliding guides in the body in the memory device having heterogeneous terminals according to a preferred embodiment of the present invention.

FIG. 10 is a view illustrating the memory unit and the connection unit sliding along sliding guides in the body in the memory device having heterogeneous terminals according to a preferred embodiment of the present invention.

Referring to FIG. 10, a first guide rail 320 is connected to both sides of the memory unit, a second guide rail 420 is formed at both sides of the connection unit 400, and the first and second sliding guides 230 and 240 may be formed at positions corresponding to the first and second guide rails 320 and 420 to guide the first and second guide rails 320 and 420 that slide. Accordingly, when the memory unit 300 slides inside the body 200, the first guide rail 320 of the memory unit 300 easily slides along the first sliding guide 230 of the body 200, and when the connection unit 400 slides inside the body 200, the second guide rail 420 of the connection unit 400 easily slides along the second sliding guide 240 of the body 200.

Figure 11:
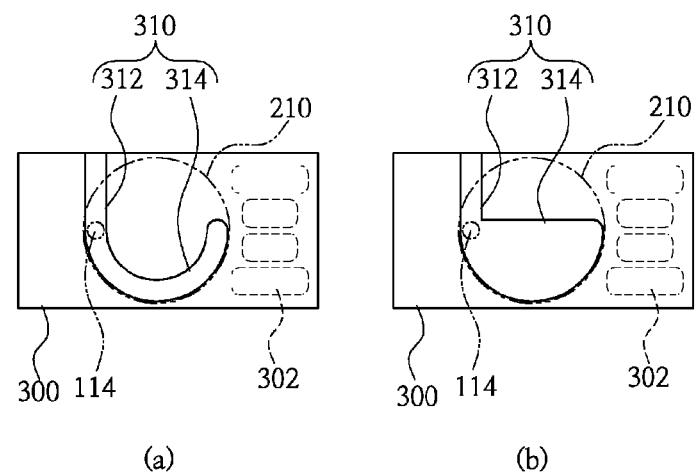
FIG. 11 is a view illustrating various shapes of a first guide of the memory unit in the memory device having heterogeneous terminals according to a preferred embodiment of the present invention.

FIG. 11 is a view illustrating various shapes of a first guide of the memory unit in the memory device having heterogeneous terminals according to a preferred embodiment of the present invention.

Referring to FIG. 11, the first guide 310 of the memory unit 300 includes a first memory guide rail 312 and a second memory guide rail 314. The first memory guide rail 312 is elongated perpendicular to the longitudinal direction of the memory unit at a first point (not shown) in which the first protrusion 114 of the housing is inserted, when the opening 202 of the body 200 is positioned toward the extension 130 of the housing 100. Accordingly, when the first protrusion 114 is revolved by forward rotation of the body 200, the first protrusion 114 is inserted in the first memory guide rail 312 of the memory unit 300 and moved along the first memory guide rail 312, in which the first protrusion 114 slides the memory unit 300 toward the opening 202 of the body 200 inside the body 200, that is, to the front, in accordance with the displacement due to the revolution of the first protrusion 114.

The second memory guide rail 314 is rotated at 180 degrees in the opposite direction to the first memory guide rail 212, along the first guide hole 210 at the first point. Accordingly, when the first protrusion 114 is revolved along the first guide hole 210 of the body 200 by backward rotation of the body 200, it is guided to revolve by the second memory guide rail 314 of the memory unit 300. Even though the first protrusion 114 is moved by the displacement due to the revolution of the first protrusion 114, the revolution path of the first protrusion 114 and the revolution path of the second memory guide rail 314 of the memory unit 300 are the same, so the first protrusion 114 does not move the memory unit 300.

When the first protrusion 114 is guided to revolve along the second memory guide rail 314 of the memory unit 300 by rotation of the body 200, the first protrusion 114 is guided outside the second memory guide rail 314, so the shape of the inside the second memory guide rail 314 is not freely limited, and accordingly, the shape of the inside of the second memory guide rail 314, as shown in (a) of FIG. 11, is not formed along the outer side of the second memory guide rail 314, and as shown in (b) of FIG. 11, the shape is not specifically limited, for example, the entire shape of the second memory guide rail 314 can be formed in a semicircular shape.

Figure 12:
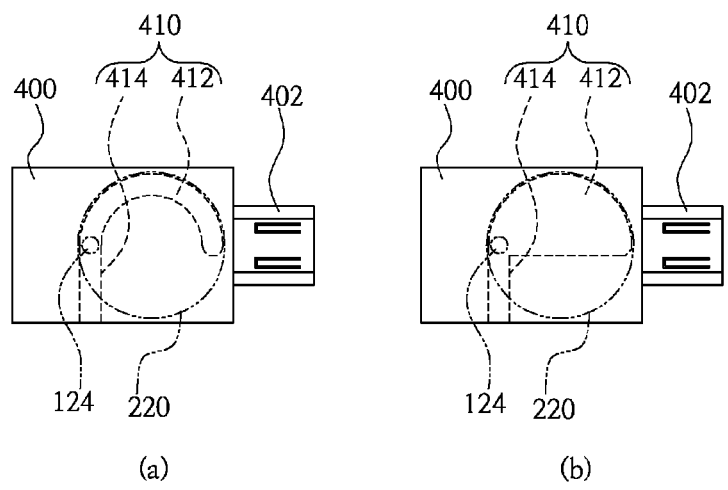
FIG. 12 is a view illustrating various shapes of a second guide of the connection unit in the memory device having heterogeneous terminals according to a preferred embodiment of the present invention.

FIG. 12 is a view illustrating various shapes of a second guide of the connection unit in the memory device having heterogeneous terminals according to a preferred embodiment of the present invention.

Referring to FIG. 12, the second guide 410 of the connection unit 400 includes a first connection guide rail 412 and a second connection guide rail 414. The first connection guide rail 412 is rotated at 180 degrees along the second guide hole 220 in the opposite direction to the second memory guide rail 314, at a second point (not shown) where the second protrusion 124 is inserted, when the opening 202 of the body 200 is positioned toward the extension 130 of the housing 100. Further, when the second protrusion 124 is revolved along the second guide hole 220 of the body 200 by forward rotation of the body 200, it is guided to revolve by the first connection guide rail 412 of the connection unit 400. Even though the second protrusion 124 is moved by the displacement due to the revolution of the first protrusion 124, the revolution path of the second protrusion 124 and the revolution path of the first connection guide rail 412 of the connection unit 400 are the same, so the second protrusion 124 does not move the connection unit 400.

The second connection guide rail 414 is elongated perpendicular to the longitudinal direction of the connection unit 400 in the opposite direction to the first memory guide rail 312 at the second point. Accordingly, when the second protrusion 124 is revolved by backward rotation of the body 200, the second protrusion 124 is inserted in the second connection guide rail 414 of the connection unit 400 and moved along the second connection guide rail 414, in which the second protrusion 124 slides the connection unit 400 toward the opening 202 of the body 200 inside the body 200, that is, to the front, in accordance with the displacement due to the revolution of the second protrusion 124.

When the second protrusion 124 is guided to revolve along the first connection guide rail 412 of the connection unit 400 by rotation of the body 200, the second protrusion 124 is guided outside the first connection guide rail 412, so the shape of the inside the first connection guide rail 412 is not freely limited, and accordingly, the shape of the inside of the first connection guide rail 412, as shown in (a) of FIG. 12, is not formed along the outer side of the first connection guide rail 412, and as shown in (b) of FIG. 12, the shape is not specifically limited, for example, the entire shape of the first connection guide rail 412 can be formed in a semicircular shape.

Hereinafter, the memory unit and the connection unit of the memory device having heterogeneous terminals according to a preferred embodiment of the present invention are described with reference to the accompanying drawings.

FIGS. 13 and 14 are views schematically showing the memory unit sliding out of the body in the memory device having heterogeneous terminals according to a preferred embodiment of the present invention and FIGS. 15 and 16 are views schematically showing the connection unit sliding out of the body in the memory device having heterogeneous terminals according to a preferred embodiment of the present invention.

Referring to FIGS. 13 to 16, in accordance with the rotation of the body 200 inside the housing 100, any one of the memory unit 300 or the connection unit 400 slides on the body 200, so any one of the first terminal 320 of the memory unit 300 or the second terminal 402 of the connection unit 400 is exposed or not to the outside of the body 200. Hereinafter, a state in which when the body 200 is rotated forward inside the housing 110, the first terminal 302 of the memory unit 300 is exposed outside the body 200 and the second terminal 402 of the connection unit is not exposed outside the body 200 is described with reference to FIGS. 13 and 14, while a state in which when the body 200 is rotated backward inside the housing 100, the second terminal 402 of the connection unit 400 is exposed outside the body 200 and the first terminal 302 of the memory unit 300 is not exposed outside the body 200 is described with reference to FIGS. 15 and 16.

First, referring to (a) of FIG. 13, the first terminal 302 of the memory unit 300 and the second terminal 402 of the connection unit 400 are positioned to face the extension 130 inside the housing 100 to be protected against external shock or dirt. Thereafter, if a user wants to insert the first terminal 302 of the memory unit 300 into an external device such as a computer, the user rotates forward the body 200 at an angle of 90 degrees with the housing 100 in a hand.

Accordingly, as shown in (b) of FIG. 13, the first protrusion 114 of the housing 100 is revolved on the body 200 about the center of the first rotary member 112 by forward rotation of the body 200 and the first protrusion 114 of the housing 100 inserted in the first memory guide rail 312 of the first guide 310 of the memory unit 300 is moved along the first memory guide rail 312, in which the memory unit 300 slides to the opening 202 of the body 200, that is, to the front in accordance with the displacement due to the revolution of the first protrusion 114.

On the other hand, the second protrusion 124 of the housing 100 is revolved on the body 200 about the center of the second rotary member 122 by forward rotation of the body 200, in which the connection unit 400 inside the body 200 does not slide inside the body 200 even through the second protrusion 124 is revolved. That is, the first connection guide rail 412 of the connection unit 400 is formed in an arc shape along the revolution direction of the second protrusion 124, so the second protrusion 124 is rotated forward at an angle of 90 degree along the first connection guide rail 412 of the connection unit 400, so the connection unit 400 does not slide inside the body 200 even though the second protrusion 124 is revolved.

Next, as in (a) of FIG. 14, when the body 200 is rotated forward again at an angle of 90 degrees, the first protrusion 114 of the housing 100 is revolved at an angle of 90 degrees on the body 200 about the center of the first rotary member 112 and the memory unit 300 slides to the front of the body 200 in accordance with the displacement by the revolution of the first protrusion 114, so the first terminal 302 of the memory unit 300 is exposed outside through the opening 202 of the body 200. The memory unit 300 exposed to the outside can be connected to an external device such as a computer.

On the other hand, the second protrusion 124 of the housing 100 is rotated forward at an angle of 90 degrees along the first connection guide rail 412 of the connection unit 400 formed along the revolution line of the second protrusion 124, so the connection unit 400 does not slide inside the body 200 by the revolution of the second protrusion 124.

As described above, according to the present invention, if necessary, selectively, the first terminal 302 of the memory unit 300 slides out of the body 200 and the second terminal 402 of the connection unit 400 can be positioned inside the body 200, so it is possible to easily connect the memory unit to an external device such as a computer, using the first terminal 302 of the memory unit 300 that is exposed outside the body 200, with the second terminal 402 of the connection unit 400 selectively positioned inside the body 200.

Further, referring (b) of FIG. 14, after transmission of data is finished, the first terminal 302 of the memory unit 300 is disconnected from an external device such as a computer, the memory unit 300 is slid to the rear of the body 200 by rotating the body 200 backward at an angle of 90 degrees, and then the first terminal 302 of the memory unit 300 is stowed inside the housing 100 to be safely kept, as in (a) of FIG. 13, by rotating the body 200 backward at an angle of 90 degrees.

As described above, since as the body 200 is rotated forward with the memory unit 300 and the connection unit 400 inside the body 200, the memory unit 300 slides inside or outside the body 200 and the connection unit 400 is maintained inside the body 200, the present invention has effect that the second terminal 402 of the connection unit 400 does not interfere with the first terminal 302 of the memory unit 300, when the first terminal 302 is used.

Next, referring to (a) of FIG. 15, the first terminal 302 of the memory unit 300 and the second terminal 402 of the connection unit 400 are positioned to face the extension 130 inside the housing 100 to be protected against external shock or dirt. Thereafter, if a user wants to insert the second terminal 402 of the connection unit 400 into an external device such as a portable terminal, the user rotates backward the body 200 at an angle of 90 degrees with the housing 100 in a hand.

Accordingly, as in (b) of FIG. 15, the first protrusion 114 of the housing 100 is revolved on the body 200 about the center of the first rotary member 112 by the backward rotation of the body 200, in which the memory unit 300 inside the body 200 does not slide inside the body 200 even though the first protrusion 114 is revolved. That is, the second memory guide rail 314 of the memory unit 300 is formed in an arc shape along the movement direction of the first protrusion 114, so the first protrusion 114 is rotated backward at an angle of 90 degrees along the second memory guide rail 314 of the memory unit 300, and accordingly, the memory unit 300 does not slide inside the body 200 by the revolution of the first protrusion 114.

On the other hand, the second protrusion 124 of the housing 100 is revolved on the body 200 about the second rotary member 122 by backward rotation of the body 200 and the second protrusion 124 of the housing 100 inserted in the second connection guide rail 414 of the second guide 410 of the connection unit 400 is moved along the second connection guide rail 414, in which the connection unit 400 slides to the opening 202 of the body 200, that is, to the front in accordance with the displacement due to the revolution of the second protrusion 124.

Next, as in (a) of FIG. 16, when the body 200 is rotated backward at an angle of 90 degrees, the first protrusion 114 of the housing 100 is rotated backward at an angle of 90 degrees along the second memory guide rail 314 of the memory unit 300 formed along the revolution line of the first protrusion 114, so the memory unit 300 does not slide inside the body 200 by the rotation of the first protrusion 114.

On the other hand, the second protrusion 124 of the housing 100 is revolved on the body 200 at an angle of 90 degrees about the center of the second rotary member 122 and the connection unit 400 slides to the front of the body 200 in accordance with the displacement due to the revolution of the second protrusion 124, so the second terminal 402 of the connection unit 400 is exposed to the outside through the opening 202 of the body 200. The exposed second terminal 402 of the connection unit 400 can be connected to a portable terminal.

As described above, according to the present invention, since, if necessary, selectively, the first terminal 302 of the memory unit 300 is positioned inside the body 200 and the second terminal 402 of the connection unit 300 slides out of the body 200, it is possible to easily connect the memory unit to a portable terminal, using the second terminal 402 of the connection unit 400 exposed outside the body 200, with the first terminal 302 of the memory unit 300 selectively positioned inside the body 200.

In this state, the second terminal 402 of the connection unit 400 is electrically connected with the first terminal 302 of the memory unit 300, as described with reference to FIG. 6, and accordingly, it is possible to connect a portable terminal and the memory device 300 without a specific gender by connecting the second terminal 402 of the connection unit 400 to a mini-USB connector of the portable terminal.

Further, referring (b) of FIG. 16, after transmission of data is finished, the second terminal 402 of the connection unit 400 is disconnected from an external device such as a computer, the connection unit 400 is slid to the rear of the body 200 by rotating the body 200 forward at an angle of 90 degrees, and then the second terminal 402 of the connection unit 400 is stowed inside the housing 100 to be safely kept, as in (a) of FIG. 15, by rotating the body 200 forward at an angle of 90 degrees.

As described above, since as the body 200 is rotated backward with the memory unit 300 and the connection unit 400 inside the body 200, the connection unit 400 slides inside or outside the body 200 and the memory unit 300 is maintained inside the body 200, the present invention has effect that the first terminal 302 of the memory unit 300 does not interfere with the second terminal 402 of the connection unit 400, when the second terminal 402 is used.

Although the present invention was described in detail with reference to an embodiment, it is apparent to those skilled in the art that the present invention can be changed and modified in various ways within the scope of the present invention and those changes and modifications are included in claims.

The invention claimed is:

1. A memory device having heterogeneous terminals, comprising:
  a housing including a first plate, a second plate disposed at a corresponding position under the first plate, and an extension integrally connecting first ends of the first plate and the second plate;
  a body rotatably disposed between the first plate and the second plate and having an opening at a first end;
  a memory unit disposed at an upper portion in the body to slide and having a first terminal at a first end; and
  a connection unit disposed at a lower portion in the body to slide and having a second terminal at a first end;
  wherein any one of the memory unit and the connection unit slides out of the body such that the moved end is exposed outside the body, with the opening of the body positioned toward second ends of the first plate and the second plate, and
  when the first terminal of the memory unit is positioned inside the body and the second terminal of the connection unit is exposed outside the body, the first terminal of the memory unit and the second terminal of the connection unit are electrically connected to each other.

2. The memory device of claim 1, wherein the first terminal and the second terminal are USB terminals having different sizes.

3. The memory device of claim 1, wherein the housing includes a first rotary member disposed on an inner side of the first plate, a first protrusion spaced outward from a center of the first rotary member, a second rotary member disposed on an inner side the second plate to face the first rotary member, and a second protrusion spaced outward from a center of the second rotary member,
  the body includes a first guide hole formed on a top facing the first rotary member such that the first rotary member is inserted, and a second guide hole formed on a bottom facing the second rotary member such that the second rotary member is inserted,
  the memory unit includes a first guide formed such that the first protrusion passing through the first guide hole is inserted, with the opening of the body positioned toward the extension of the housing,
  the connection unit includes a second guide formed such that the second protrusion passing through the second guide hole is inserted, with the opening of the body positioned toward the first ends of the first plate and the second plate, and
  when the body is rotated forward or backward, the first protrusion or the second protrusion is moved along the first guide or the second guide, which is elongated, and revolved about a center of the first rotary member of the second rotary member, and the memory unit or the connection unit slides inside or outside the body in accordance with displacement by the revolution of the first protrusion or the second protrusion, so the first terminal or the second terminal is exposed outside the body or not.

4. The memory device of claim 3, wherein the first guide of the memory unit includes a first memory guide rail elongated perpendicular to the longitudinal direction of the memory unit at a first point in which the first protrusion is inserted, when the opening of the body is positioned toward the extension of the housing, and a second memory guide rail formed in the opposite direction to the first memory guide rail, along the first guide hole at the first point,
  the second guide of the connection unit includes a first connection guide rail formed along the second guide hole in the opposite direction to the second memory guide rail, at a second point where the second protrusion is inserted, when the opening of the body is positioned toward the extension of the housing, and a second connection guide rail elongated perpendicular to the longitudinal direction of the connection unit in the opposite direction to the first memory guide rail at the second point,
  when the opening of the body positioned toward the extension of the housing is rotated forward to the second ends of the first plate and the second plate of the housing, the first protrusion positioned between the first memory guide rail and the second memory guide rail revolves along the first memory guide rail and slides the memory unit, the second protrusion positioned between the first connection guide rail and the second connection guide rail revolves along the first connection guide rail formed in a revolution direction of the second protrusion without moving the connection unit, and
  when the opening of the body positioned toward the extension of the housing is rotated backward to the second ends of the first plate and the second plate of the housing, the first protrusion positioned between the first memory guide rail and the second memory guide rail moves along the second memory guide rail formed in a movement direction of the first protrusion without moving the memory unit, and the second protrusion positioned between the first connection guide rail and the second connection guide rail moves along the second connection guide rail and slides the connection unit.

5. The memory device of claim 3, wherein guide rails are formed on sides of the memory unit or the connection unit and sliding guides are formed at positions corresponding to the guide rails in the body so that the guide rails are guided to slide.

6. The memory device of claim 4, wherein when the opening of the body positioned toward the extension of the housing is rotated forward the second ends of the first plate and the second plate of the housing, an outer side of the second memory guide rail of the memory unit is formed to face a revolution path of the first protrusion and an inner side of the second memory guide rail is formed to face or not the revolution path of the first protrusion, and the opening of the body positioned toward the extension of the housing is rotated backward the second ends of the first plate and the second plate of the housing, an outer side of the first connection guide rail of the connection unit is formed to face a revolution path of the second protrusion and an inner side of the first connection guide rail of the connection unit is formed to face or not the revolution path of the first protrusion.

7. The memory device of claim 1, wherein a connection terminal is formed on a top of the connection unit to be electrically connected with the first terminal when the first terminal of the memory unit is positioned inside the body and the second terminal of the connection unit is exposed outside the body.

8. The memory device of claim 1, wherein a substrate is disposed between the memory unit and the connection unit, and when the first terminal of the memory unit is positioned inside the body and the second terminal of the connection unit is exposed outside the body, a top of the substrate is electrically connected with the first terminal of the memory unit and a bottom of the substrate is electrically connected with the connection unit.

9. The memory device of claim 1, wherein the memory unit and the connection unit are electrically connected to each other by a connection wire.

* * * * *